(12) United States Patent
Xi

(10) Patent No.: US 11,676,810 B2
(45) Date of Patent: Jun. 13, 2023

(54) SEMICONDUCTOR STRUCTURE PROCESSING METHOD AND FORMING METHOD

(71) Applicant: CHANGXIN MEMORY TECHNOLOGIES, INC., Anhui (CN)

(72) Inventor: Ning Xi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/444,055

(22) Filed: Jul. 29, 2021

(65) Prior Publication Data
US 2022/0005686 A1 Jan. 6, 2022

Related U.S. Application Data

(63) Continuation of application No. PCT/CN2021/095589, filed on May 24, 2021.

(30) Foreign Application Priority Data

Jul. 2, 2020 (CN) .......................... 202010633744.2

(51) Int. Cl.
*H01L 21/02* (2006.01)
*H01L 21/311* (2006.01)
*H01L 21/308* (2006.01)

(52) U.S. Cl.
CPC ...... *H01L 21/02057* (2013.01); *H01L 21/308* (2013.01); *H01L 21/31116* (2013.01)

(58) Field of Classification Search
None
See application file for complete search history.

(56) References Cited

U.S. PATENT DOCUMENTS

| 7,682,986 B2 | 3/2010 | Chi |
| 8,440,573 B2 | 5/2013 | Mikhaylichenko |

(Continued)

FOREIGN PATENT DOCUMENTS

| CN | 101330035 A | 12/2008 |
| CN | 101606231 A | 12/2009 |

(Continued)

OTHER PUBLICATIONS

Supplementary European Search Report in European application No. 21816301.2, dated Jul. 6, 2022.

(Continued)

*Primary Examiner* — Stephanie P Duclair
(74) *Attorney, Agent, or Firm* — Syncoda LLC; Feng Ma

(57) ABSTRACT

A semiconductor structure processing method and forming method are provided. The semiconductor structure processing method includes the steps of: providing a semiconductor substrate, which is provided with feature portions having a mask layer on their top surfaces; ashing a semiconductor structure comprising the semiconductor substrate, the feature portions and the mask layer; removing the mask layer; cleaning the semiconductor structure, and forming an oxide layer on surfaces of the feature portions after the feature portions are cleaned; drying the semiconductor structure; and removing the oxide layer. During drying, one feature portion of at least one group of adjacent feature portions is inclined towards a feature portion adjacent thereto, and a distance between the inclined feature portion and the feature portion adjacent thereto after drying is smaller than a distance there between before drying.

19 Claims, 9 Drawing Sheets

(56) References Cited

U.S. PATENT DOCUMENTS

| | | |
|---|---|---|
| 8,791,027 B2 | 7/2014 | Kofuji |
| 8,906,194 B2 | 12/2014 | Chi |
| 9,196,472 B2 | 11/2015 | Ohto |
| 9,362,133 B2 | 6/2016 | Shamma et al. |
| 9,449,821 B2 | 9/2016 | Yang et al. |
| 9,953,840 B2 | 4/2018 | Marumoto et al. |
| 9,991,116 B1 | 6/2018 | Liu et al. |
| 10,192,759 B2 | 1/2019 | Shamma et al. |
| 2005/0022839 A1* | 2/2005 | Savas ............... F16B 33/02 134/21 |
| 2005/0079717 A1 | 4/2005 | Savas |
| 2007/0059941 A1 | 3/2007 | Park |
| 2008/0188081 A1 | 8/2008 | Chi |
| 2010/0132889 A1 | 6/2010 | Chi |
| 2010/0311246 A1 | 12/2010 | Kofuji |
| 2011/0183522 A1* | 7/2011 | Mikhaylichenko ........................ H01L 21/02068 257/E21.228 |
| 2011/0189858 A1* | 8/2011 | Yasseri ............. H01L 21/02057 438/704 |
| 2012/0088357 A1* | 4/2012 | Ogawa ............... H01L 27/1052 257/E21.334 |
| 2012/0135604 A1 | 5/2012 | Ohto |
| 2014/0170853 A1 | 6/2014 | Shamma et al. |
| 2016/0020211 A1 | 1/2016 | Yang et al. |
| 2016/0254171 A1 | 9/2016 | Shamma et al. |
| 2017/0186620 A1* | 6/2017 | Marumoto .......... H01L 21/6704 |
| 2018/0076022 A1 | 3/2018 | Choi et al. |
| 2018/0144929 A1 | 5/2018 | Liu |
| 2021/0335594 A1 | 10/2021 | Lee |

FOREIGN PATENT DOCUMENTS

| | | |
|---|---|---|
| CN | 101908480 A | 12/2010 |
| CN | 102484056 A | 5/2012 |
| CN | 102714155 A | 10/2012 |
| CN | 105489529 A | 4/2016 |
| CN | 106229288 A | 12/2016 |
| CN | 106856163 A | 6/2017 |
| CN | 106920743 A | 7/2017 |
| CN | 208142187 U | 11/2018 |
| EP | 3951837 A1 | 2/2022 |

OTHER PUBLICATIONS

International Search Report in the international application No. PCT/CN2021/095582, dated Aug. 23, 2021.

International Search Report in the international application No. PCT/CN2021/095589, dated Aug. 24, 2021.

* cited by examiner

SEMICONDUCTOR STRUCTURE PROCESSING METHOD AND FORMING METHOD

CROSS-REFERENCE TO RELATED APPLICATIONS

This application is a continuation of International Application No. PCT/CN2021/095589 filed on May 24, 2021, which claims priority to Chinese Patent Application No. 202010633744.2 filed on Jul. 2, 2020. These applications are hereby incorporated by reference in their entirety.

BACKGROUND

Multiple processing procedures, such as material deposition, planarization, feature patterning, etching and cleaning, are usually required in a semiconductor manufacturing process. With the continuous reduction of the sizes of elements of integrated circuits, manufacturing processes are increasingly complex, and high aspect ratio (HAR) structures are increasingly important. Due to the reduction of the sizes of the elements, the depth of feature portions is unchanged or increased and the width of the feature portions is decreased, so that an aspect ratio of the feature portions is increased. An HAR structure process is highly prone to problems such as lateral bending, top and bottom critical dimension (CD) variations, necking, inclination, pattern distortion, etc. How to improve the quality of the HAR structure and prevent the inclination of the HAR structure is an urgent problem to be solved.

SUMMARY

The present disclosure relates to the technical field of semiconductors, and relates to a semiconductor structure processing method and forming method.

An embodiment of the present disclosure provides a semiconductor structure processing method which may include: providing a semiconductor substrate, which is provided with feature portions having a mask layer on their top surfaces; ashing a semiconductor structure including the semiconductor substrate, the feature portions and the mask layer; removing the mask layer; cleaning the semiconductor structure, and forming an oxide layer on surfaces of the feature portions after the feature portions are cleaned; drying the semiconductor structure; and removing the oxide layer. During drying, in at least one pair of adjacent feature portions, one feature portion may incline towards the other feature portion, and a distance between the inclined feature portion and the feature portion adjacent thereto after drying may be smaller than a distance therebetween before drying.

An embodiment of the present disclosure also provides a semiconductor structure forming method, which may include: providing a semiconductor substrate and a mask layer on the semiconductor substrate; etching the semiconductor substrate to form discrete feature portions by taking the mask layer as a mask; ashing a semiconductor structure including the semiconductor substrate, the feature portions and the mask layer; removing the mask layer; cleaning and drying the semiconductor structure in sequence; and removing an oxide layer.

DETAILED DESCRIPTION

Figure 1:
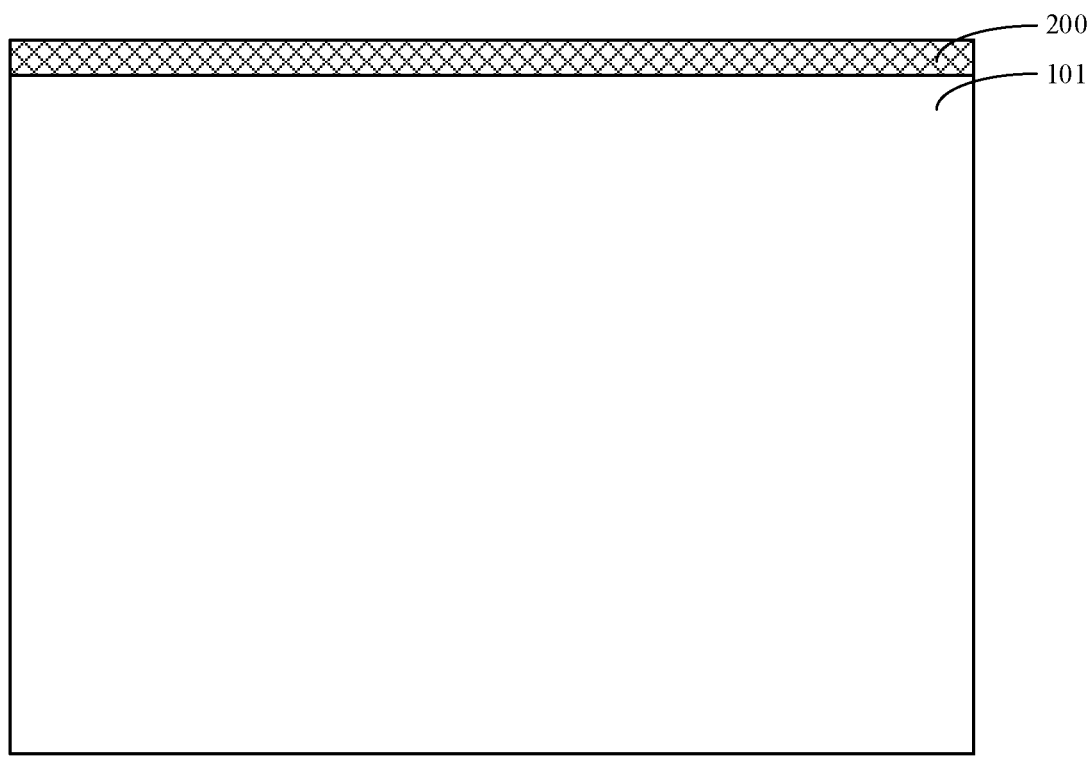
FIG. 1 is a first cross-sectional schematic diagram corresponding to operations of a semiconductor structure processing method according to an example of the present disclosure.

The inclination of an HAR structure caused by a capillary force is a serious problem and may lead to semiconductor defects. With the increase of the integration level of semiconductors, the HAR structure is more commonly used. The HAR structure may be a feature portion having an aspect ratio more than 5:1, 10:1 or 20:1. In the semiconductor manufacturing process of an HAR structure, especially an HAR structure having an aspect ratio more than 10, during the cleaning and drying processes, the HAR structure is inclined or even collapsed due to the capillary force. As the aspect ratio is higher, the inclination is more serious.

However, the applicant found that methods for reducing the inclination of an HAR structure have been developed and applied. For example, supercritical carbon dioxide is used for the drying process during cleaning of wafer. The process is expensive and often requires precise control. Isopropanol required for the drying process needs to be precisely weighed, and supercritical carbon dioxide needs to reach a critical point under a high pressure.

Therefore, there is an urgent need for a low-cost and simple processing method to reduce the problem of inclination of an HAR structure when cleaning the HAR structure.

In order to solve the above problem, an embodiment of the present disclosure provides a semiconductor structure processing method. The method includes the following operations. A semiconductor substrate is provided. The semiconductor substrate is provided with feature portions which have a mask layer on their top. The semiconductor structure, which includes the semiconductor substrate, the feature portions and the mask layer, is ashed. The mask layer is removed. The semiconductor structures are cleaned, and an oxide layer is generated on the surface of the feature portion after the feature portions are cleaned. The semiconductor structure is dried. The oxide layer is removed. During the drying process, one feature portion of at least one group of adjacent feature portions may incline towards the other feature portion, and a distance between the adjacent feature portions after the drying process is smaller than a distance therebetween before the drying process.

To more clarify the objects, technical solutions and advantages of the examples of the present disclosure, various examples of the present disclosure will be described below in combination with the accompanying drawings. However, those of ordinary skill in the art will appreciate that in various examples of the present disclosure, numerous technical details are set forth in order to provide readers with a better understanding of the present disclosure. However, even without these technical details and various changes and modifications based on the following examples, the claimed technical solution of the present disclosure may be implemented. The following divisions of the various examples are for convenience of description and should not be construed as limiting specific implementations of the present disclosure, and the various examples may be combined and cited with each other without contradiction.

FIGS. 1 to 6 are cross-sectional schematic diagrams corresponding to steps of a semiconductor structure processing method according to an example of the present disclosure. The semiconductor structure processing method of the present example will be described below in detail.

Figure 2:
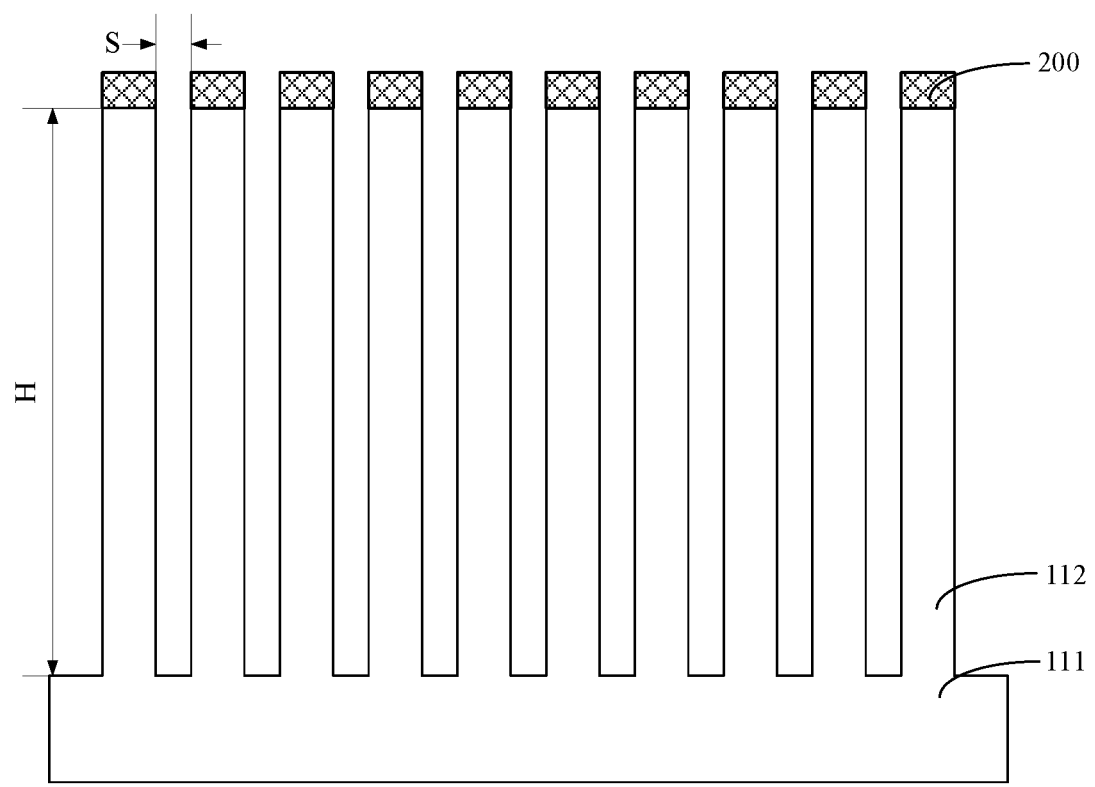
FIG. 2 is a second cross-sectional schematic diagram corresponding to operations of a semiconductor structure processing method according to an example of the present disclosure.

Referring to FIGS. 1 and 2, a semiconductor substrate 111 is provided. The semiconductor substrate is provided with feature portions 112. The feature portions 112 have a mask layer 200 on their top surfaces.

Specifically, referring to FIG. 1, a mask layer 200 is formed on a substrate 101. The substrate 101 is etched based on the mask layer 200 to form a semiconductor substrate 111 and discrete feature portions 112 as shown in FIG. 2. The feature portions 112 are provided with the mask layer 200. In the present example, the semiconductor substrate 111 is formed of a material such as silicon or germanium, and the mask layer 200 is formed of silicon dioxide. In other examples, the mask layer 200 may be formed of other insulating materials such as silicon nitride or silicon oxynitride. In addition, the feature portions 112 provided in the present example are used for subsequently forming active areas. The inclination of the feature portions 112 may result in the inclination of the formed active areas, i.e., the feature portions 112 in a vertical state may avoid the inclination of the active areas. In addition, the technical solution may also be used for realizing other areas.

Referring to FIG. 2, the height of the feature portions 112 is H, a gap between two adjacent discrete feature portions 112 is S, and an aspect ratio H/S of the feature portions 112 is relatively larger. In the example, the aspect ratio H/S of the feature portions 112 is 10. In other examples, the aspect ratio of the feature portions may be 5, 8, 12, 15, etc., which may be set according to actual demands. In addition, an aspect ratio H/S of the feature portions may also be set to be more than a preset aspect ratio, which may be 5, 8, 10, 12, 15, etc. In the semiconductor manufacturing process where the aspect ratio of the feature portions 112 is large, the defect of inclination of the feature portions 112 readily occurs. It is known to those skilled in the art that limitation of the aspect ratio of the feature portions 112 in the examples is to ensure that the feature portions 112 will incline in a subsequent drying process. The technical solutions in which the feature portions 112 incline subsequently due to the limited aspect ratio also fall within the protection scope of the present disclosure.

The semiconductor structure is ashed. The semiconductor structure includes the semiconductor substrate 111, the feature portions 112 and the mask layer 200. The process of ashing is used for ashing the remaining etching gas or etching liquid after etching to prevent the residual etching gas or etching liquid from continuously etching the semiconductor substrate 111 and the feature portions 112.

Specifically, the example shows two processes of ashing, particularly as follows.

In an oxygen-free ashing process, the semiconductor substrate 111, the feature portions 112 and the mask layer 200 are ashed by using a first mixed gas which is oxygen-free, and at least includes hydrogen and nitrogen in order to remove corrosive gases and polymeric materials remaining on the surfaces after etching. For the oxygen-free ashing process, the first mixed gas does not contain oxygen and does not damage the surfaces of the semiconductor substrate 111 and the feature portions 112 (the surfaces of the feature portions 112 and the semiconductor substrate 111 will not be oxidized, e.g. silicon will not be oxidized). Therefore, in the present example, the process of ashing adopts the oxygen-free ashing process. In addition, hydrogen can be used to effectively remove corrosive gases and polymeric materials remaining on the surfaces of the feature portions and the semiconductor substrate 111.

In an oxygen-containing ashing process, the semiconductor substrate 111, the feature portions 112 and the mask layer 200 are ashed by using a second mixed gas which contains oxygen, which at least includes hydrogen, nitrogen and oxygen. For the oxygen-containing ashing process, the second mixed gas contains oxygen, so that the ashing efficiency is higher, and corrosive gases and polymeric materials remaining on the surfaces after etching can be removed more quickly. In other examples, the process of ashing may adopt the oxygen-containing ashing process.

Figure 3:
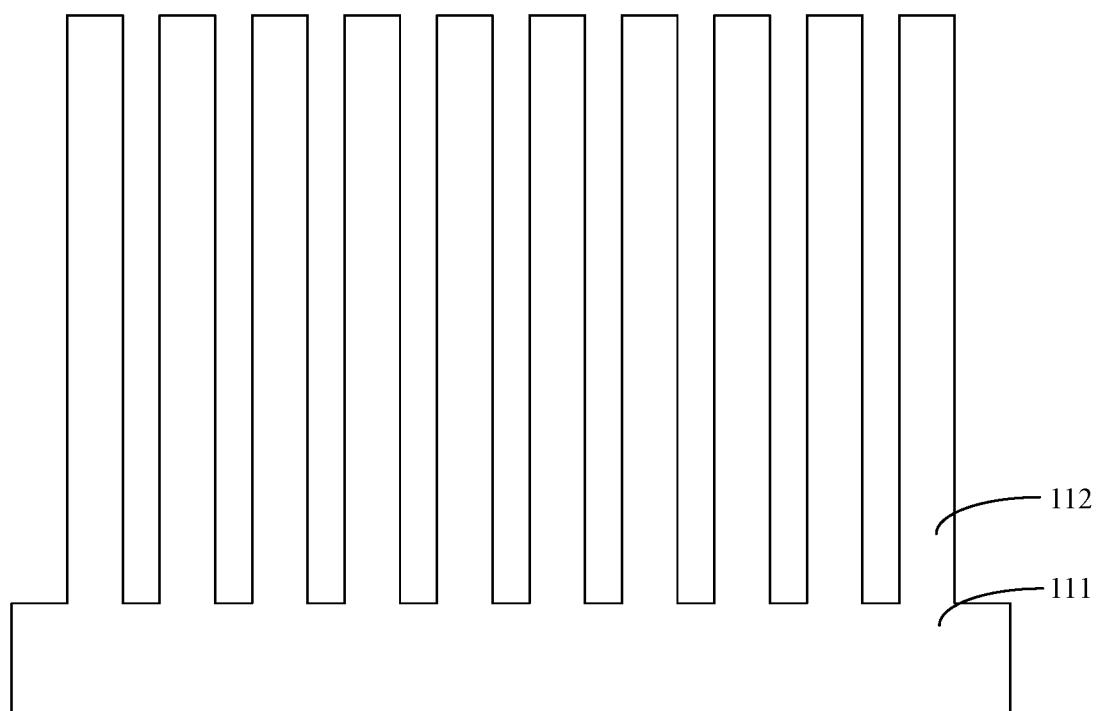
FIG. 3 is a third cross-sectional schematic diagram corresponding to operations of a semiconductor structure processing method according to an example of the present disclosure.

Referring to FIG. 3, the mask layer 200 is removed.

Figure 4:
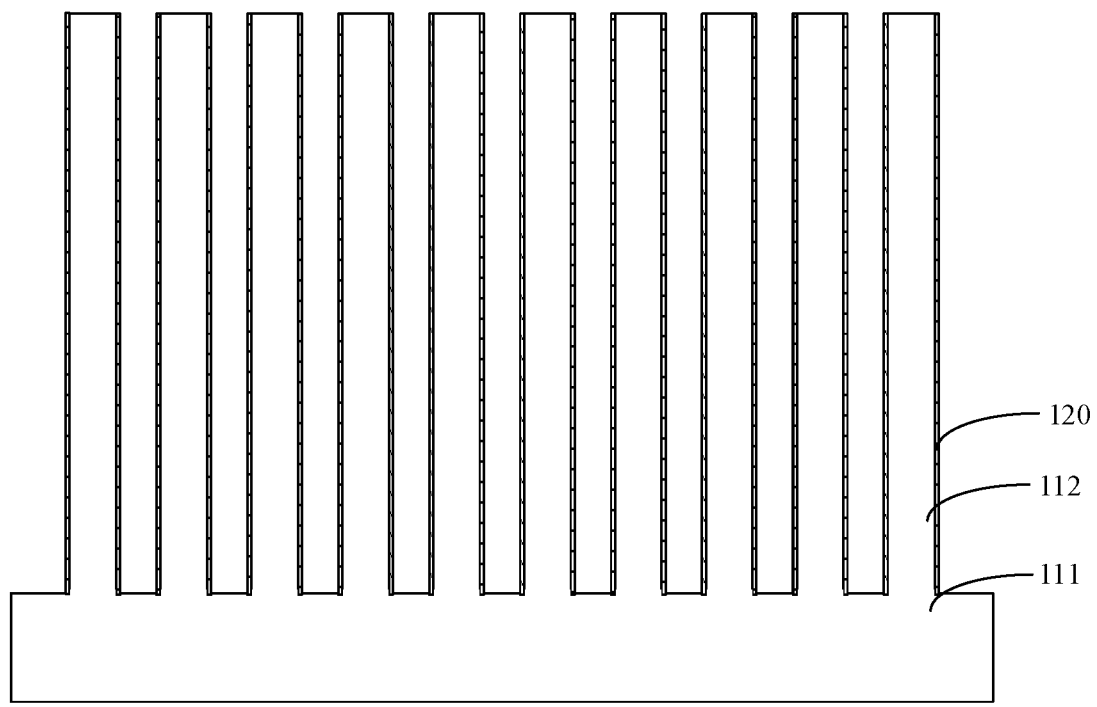
FIG. 4 is a fourth cross-sectional schematic diagram corresponding to operations of a semiconductor structure processing method according to an example of the present disclosure.

Referring to FIG. 4, the semiconductor structure is cleaned. The semiconductor structure includes the semiconductor substrate 111, the feature portions 112 and the mask layer 200. Since the mask layer 200 has been removed, only the semiconductor substrate 111 and the feature portions 112 are cleaned.

The process of cleaning is used for repairing defects on the surfaces of the feature portions 112. That is, recesses formed by over-etching partial side walls or protrusions formed by incompletely etching partial side walls in the process of forming the feature portions 112 by etching, so that the surfaces of the feature portions 112 are uneven. The surfaces of the feature portions 112 are oxidized to form an oxide layer 120 after the process of cleaning.

Specifically, a mixed liquid of $NH_4OH$, $H_2O_2$ and $H_2O$ (i.e. SC-1 mixed liquid) is used in the cleaning. The ratio (volume ratio) of $NH_4OH$, $H_2O_2$ and $H_2O$ satisfies $NH_4OH$:$H_2O_2$:$H_2O$=1:1~4:20~100.

Due to the strong oxidability of the mixed liquid used in the cleaning process, an oxide layer 120 is formed on the surface of a part of each feature portion 112 during the cleaning process.

It should be noted that the partial semiconductor substrate 111 is also oxidized during cleaning. Since the oxidized semiconductor substrate 111 does not involve the creative of the disclosure, the oxidized semiconductor substrate 111 is not explicitly indicated in the figures. It would be obvious to those skilled in the art that during cleaning, a part of the semiconductor substrate 111 is also oxidized to form an oxide layer 120.

Figure 5:
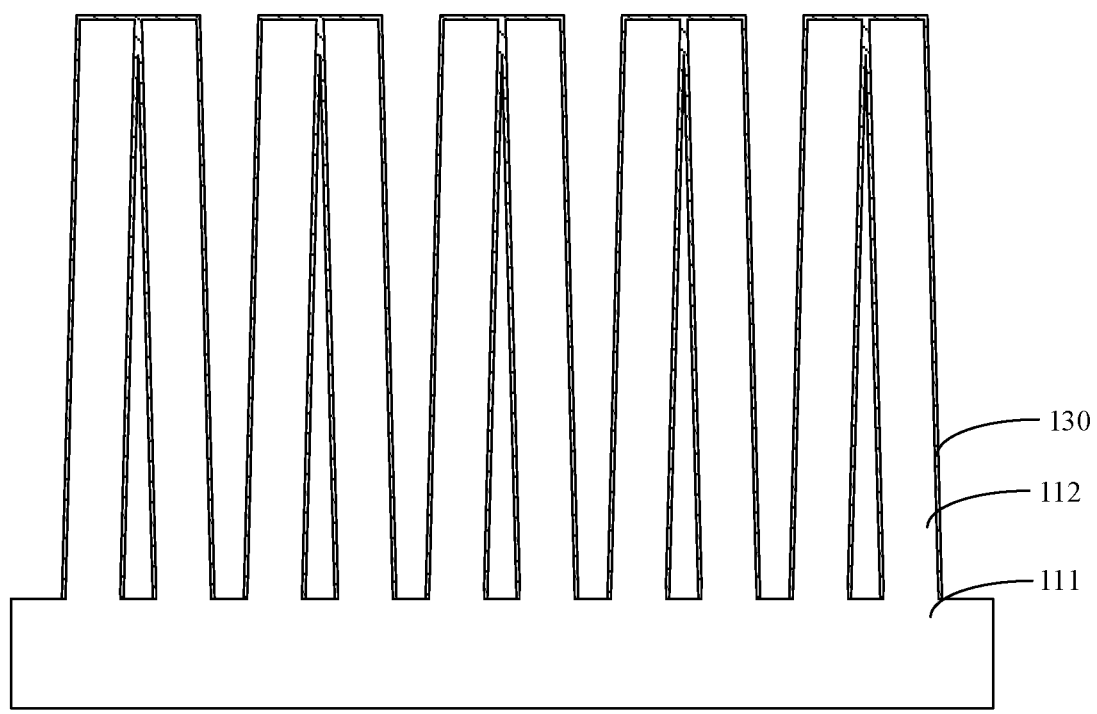
FIG. 5 is a fifth cross-sectional schematic diagram corresponding to operations of a semiconductor structure processing method according to an example of the present disclosure.

Referring to FIG. 5, the semiconductor structure is dried after being cleaned. The semiconductor structure includes the semiconductor substrate 111, the feature portions 112 and the mask layer 200. Since the mask layer 200 has been removed, the semiconductor substrate 111, the feature portions 112 and the oxide layer 120 (referring to FIG. 4) are dried.

The process of drying includes the following operations. The surface of a part of the feature portions 112 is dried by using isopropanol (IPA) at a first temperature. The bottom of the substrate 111 is dried by using deionized water at a second temperature, when the surface of the part of the feature portions 112 is dried.

A semiconductor substrate is, for example, a wafer. The process is to supply hot deionized water to the back surface of the wafer during drying and simultaneously supply heated isopropanol to the front surface of the wafer. The reason is that if the back surface of the wafer is not heated, the temperature of isopropanol reaching the front surface of the wafer is lowered, and the temperature of the wafer is controlled by the hot deionized water supplied to the back surface, thereby preventing the center temperature and the edge temperature of the wafer from being different. In this way, the effect of drying of isopropanol can be further enhanced to better dry the wafer.

The first temperature is in range of 60~80° C., and the second temperature is in angle of 60~80° C. In the present example, the first temperature or the second temperature may be 65° C., 70° C. or 75° C.

During drying, in one pair out of at least one group of adjacent feature portions 112, one feature portion is inclined towards the other feature portion 112 adjacent thereto, and a distance between the inclined feature portion 112 and the adjacent feature portion 112 after drying is smaller than that before drying. In the example, it is illustrated with the case in which the oxide layers 120 on the respective surfaces of the inclined feature portions 112 are bonded to each other.

Figure 7:
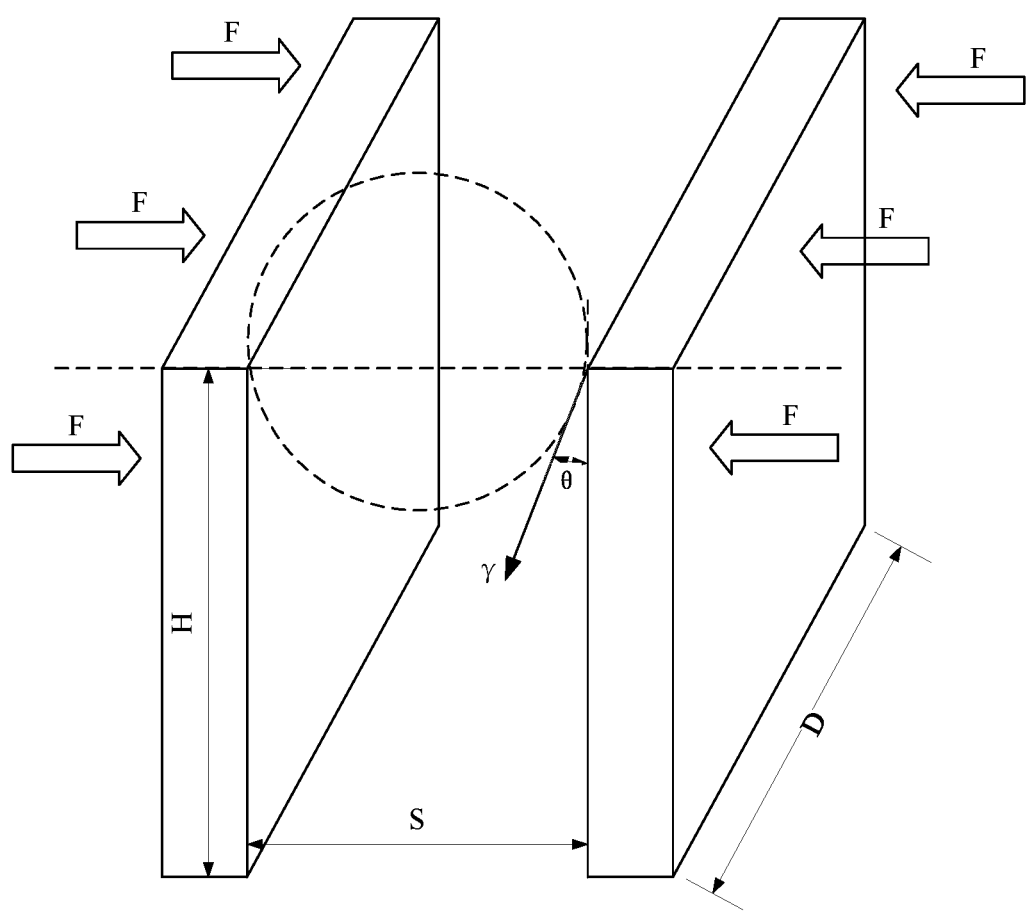
FIG. 7 is a schematic diagram of inclination of a feature portion in a semiconductor structure processing method according to an example of the present disclosure.

Particularly, during drying, the capillary force of a chemical reagent may generate sufficient force during drying to cause the inclination of the remaining feature portions. The principle refers to FIG. 7. As shown in the figure, two discrete protrusion portions (each protrusion portion includes a feature portion and an oxide layer on the surface of the feature portion, and the protrusion portion may structurally have a narrow upper end and a wide lower end, or equally wide upper and lower ends, or a wide upper end and a narrow lower end; the equally wide upper and lower ends of the protrusion portion shown in the figures of the example are only schematic illustrations, and after an actual etching process, the bottom of the protrusion portion is wider than the wider of its top). Due to the existence of a width difference, the surface tension of the top of the protrusion is in a $\gamma$ direction of a tangential line, an angle between the $\gamma$ direction and a vertical direction is $\theta$, and the capillary force acting on two sides of the protrusion satisfies $F=2\gamma HDt \cos \theta/S$, in which H, D and S are the height and length of the protrusion portion and a distance between the adjacent protrusion portions respectively, and t is the acting time of the capillary force F.

From the above discussion, when other conditions ($\gamma$, D, t, $\cos \theta$ and S) are constant, the capillary force F is proportional to the height H of the protrusion portions, i.e. the capillary force F is larger at a higher position of the protrusion portions, and the degree of inclination is larger correspondingly. At this moment, the degree of inclination of the feature portion 112 at the top end of the protrusion portion is maximum so that the oxide layer on the surfaces of the inclined feature portions 112 are bonded together to form a bonded oxide layer 130. Although the lower portion of the feature portion 112 also inclines, the degree of inclination of the lower portion of the feature portion 112 is much smaller than that of the top of the feature portion 112.

In the present example, the method further includes the operation in which the oxide layer 120 is subjected to a compensation treatment before the oxide layer is removed. After the compensation treatment of the oxide layer 120 is performed, the thickness of the oxide layer 120 formed by oxidation of each feature portion 112 is increased, i.e., a part of each feature portion 112 is compensated and oxidized to form the oxide layer 120. The width of the feature portions 112 is reduced while the thickness of the oxide layer 120 is increased in a horizontal direction, so that after the oxide layer 120 is removed, it is ensured that the feature portions 112 may be restored, or the speed of restoring the feature portions 112 is accelerated.

Specifically, the present example shows two specific methods for the compensation treatment.

In the first method, the compensation treatment of the oxide layer 120 is performed by using a third mixed gas which at least includes hydrogen, nitrogen and oxygen.

With the first method of compensation treatment, the oxidation degree of the feature portions 112 at a higher part and the oxidation degree of the feature portions 112 at a lower part are same.

In the second method, the compensation treatment of the oxide layer 120 is performed by using mixed plasma which at least includes plasma of hydrogen, nitrogen and oxygen. Specifically, the oxide layer 120 is formed by using the inductively coupled plasma (ICP) plasma so as to achieve the purpose of oxidizing the feature portions 112. Since the aspect ratio is high and the diameter of the feature portions 112 is large, the distance over which the plasma descends in a short time under a high temperature and a high pressure is limited so that different depths correspond to different oxidation degrees. With the second method of the compensation treatment, the oxidation degree of each feature portion 112 at a higher part and the oxidation degree of each feature portion 112 at a lower part are not consistent. The oxidation degrees of the feature portions 112 from top to bottom are smaller and smaller, i.e. the higher of the oxide layer 120, the thicker of the oxide layer 120.

In the present example, the second method of compensation treatment is adopted to compensate the oxide layer 120, so that the thickness of the oxide layer 120 formed by oxidation of the top of the feature portions 112 is increased. After the oxide layer 120 is removed, it is ensured that the feature portions 112 may be restored or the speed of restoring the feature portions 112 is accelerated, the thickness of the oxide layer 120 on the surfaces of the lower part of the feature portions 112 is not changed greatly, and unnecessary loss of the feature portions 120 is avoided.

Figure 6:
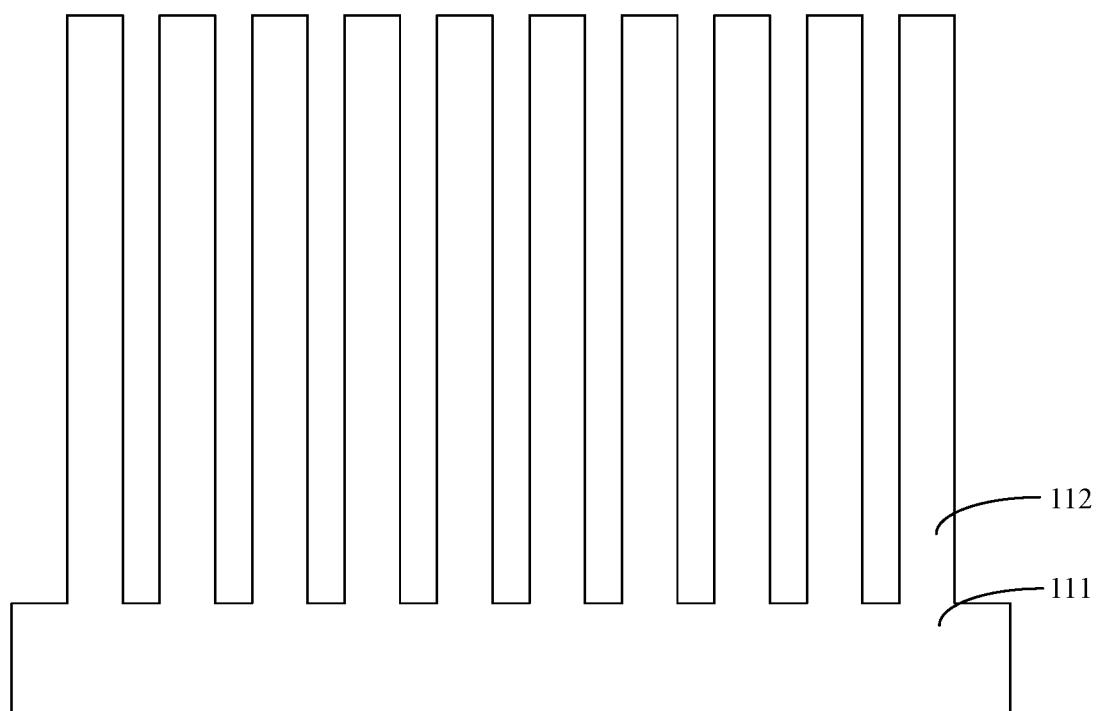
FIG. 6 is a sixth cross-sectional schematic diagram corresponding to operations of a semiconductor structure processing method according to an example of the present disclosure.

Referring to FIGS. 5 and 6, after drying, the oxide layer on the surface of the inclined feature portion 112 is removed.

In the present example, after drying, the oxide layers on the surfaces of the inclined feature portions 112 are bonded to form a bonded oxide layer 130 (referring to FIG. 5). After the bonded oxide layer 130 is removed, the inclined feature portions 112 are gradually restored (i.e., to a vertical state) since a bonding force of the bonded oxide layer 130 disappears and no capillary force is applied to the inclined feature portions 112.

Specifically, the oxide layer is removed from the surfaces of the inclined feature portions 112 by a chemical method, and an etching selection ratio of a chemical gas adopted in the chemical method to the oxide layer and the inclined feature portions 112 is more than 500:1. By using the chemical gas with a large etching selection ratio, the inclined feature portions 112 are prevented from being etched as much as possible in the process of removing the oxide layer by etching.

Figure 8:
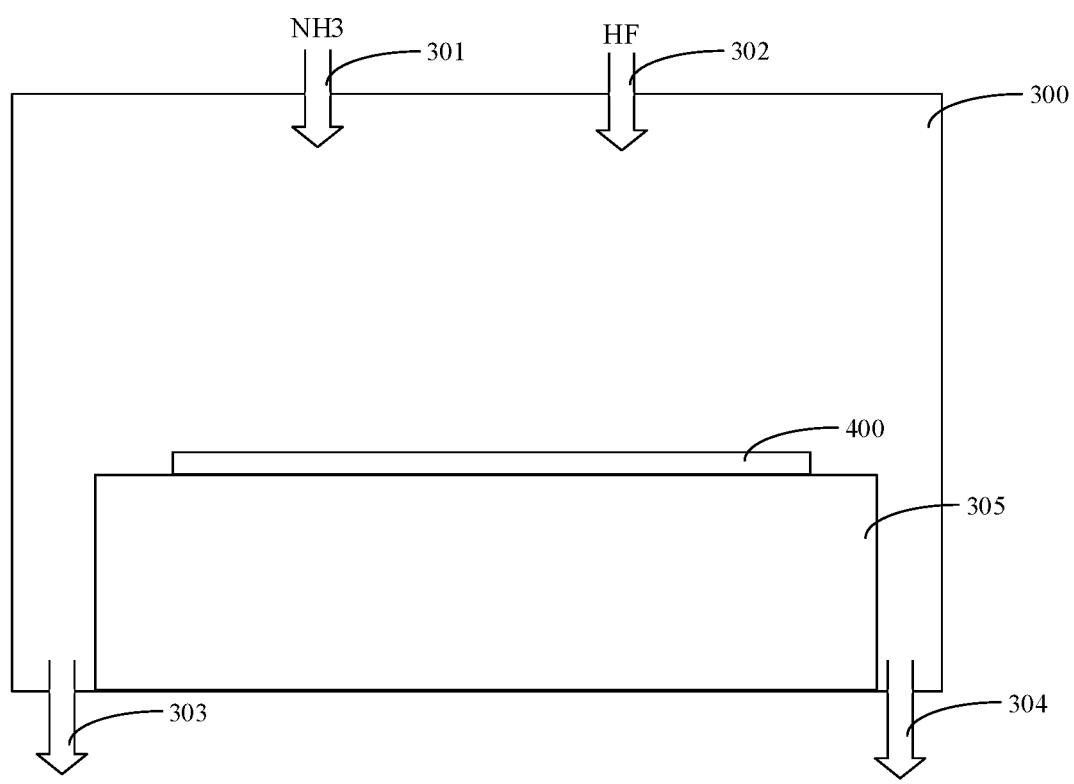
FIG. 8 is a first schematic flowchart of a chemical etching process according to an example of the present disclosure.
Figure 9:
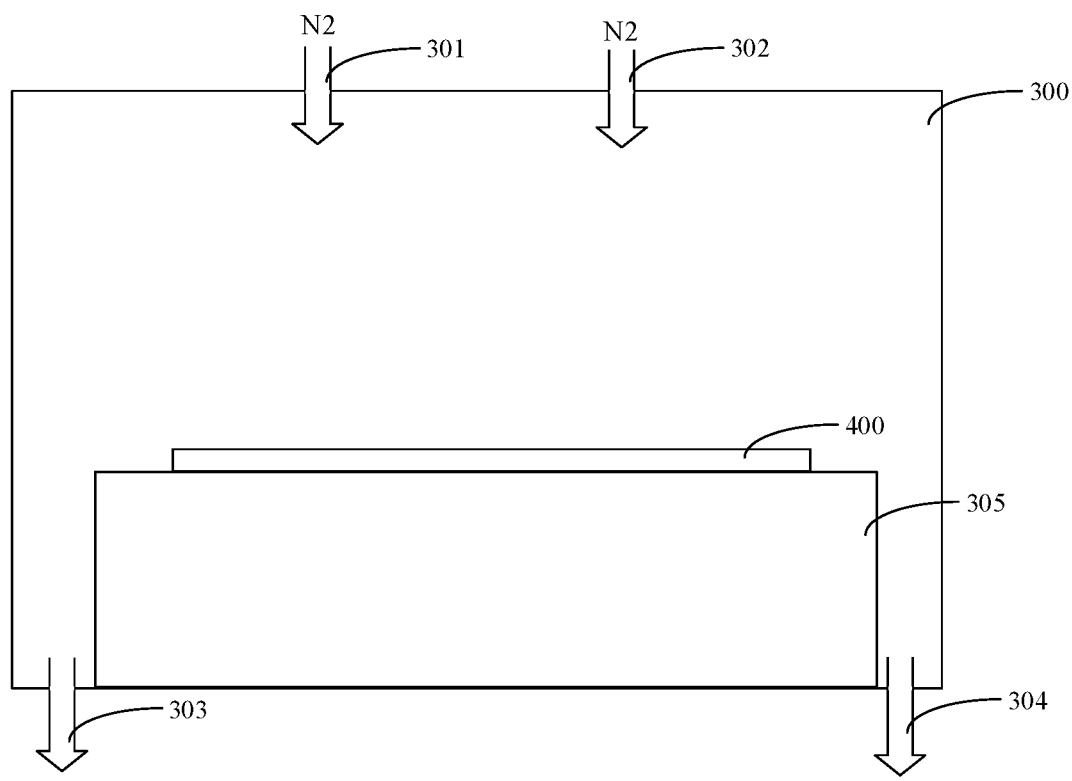
FIG. 9 is a second schematic flowchart of a chemical etching process according to an example of the present disclosure.

Specifically, referring to FIGS. 8 and 9, the chemical method adopted to remove the oxide layer on the surfaces of the inclined feature portions 112 includes the following operations.

A semiconductor structure 400 is integrally disposed in a reaction chamber 300. The reaction chamber 300 at least includes two gas inlets (a first gas inlet 301 and a second gas inlet 302), two gas outlets (a first gas outlet 303 and a second gas outlet 304) and a bearing platform 305 for bearing the whole semiconductor structure 400.

A chemical gas is introduced into the reaction chamber 300. The chemical gas at least includes ammonia and hydrogen fluoride. In the present example, the chemical gas also includes argon.

Specifically, referring to FIG. 8, ammonia is introduced into the reaction chamber 300 through the first gas inlet 301, and hydrogen fluoride is introduced into the reaction chamber 300 through the second gas inlet 302.

At this moment, the semiconductor structure 400 located on the bearing platform 305 integrally reacts as follows:

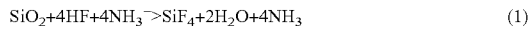

$$SiO_2 + 4HF + 4NH_3 \rightarrow SiF_4 + 2H_2O + 4NH_3 \quad (1)$$

$$SiF_4 + 2HF + 2NH_3 \rightarrow (NH_4)_2SiF_6 \quad (2)$$

In reaction (1), hydrogen fluoride reacts with the oxide layer in the whole semiconductor structure 400 as a reaction gas to form $SiF_4$, and ammonia is used as a catalyst to accelerate the reaction. In reaction (2), ammonia and hydrogen fluoride are simultaneously used as reaction gases, and continuously react with $SiF_4$ formed in the first reaction to form a volatile $(NH_4)_2SiF_6$ solid. Meanwhile, in the above reactions, argon may also be introduced as a carrier gas, and the argon may prevent the hydrogen fluoride gas from being condensed in a gas inlet pipeline (specifically, the second gas inlet 302 in the present example) for carrying the hydrogen fluoride gas to the whole semiconductor structure 400 for reaction.

When the above reactions occur, it is necessary to ensure that the whole semiconductor structure 400 in the reaction chamber is at a third temperature, and the temperature of the whole semiconductor structure 400 is changed through the bearing platform 305. The third temperature is in a range of 30° C.-150° C., specifically for example, 50° C., 70° C., 90° C., 110° C. or 130° C. In the present example, the third temperature is 35° C.

After the chemical reaction, the thermal treatment of the oxide layer is performed at a fourth temperature, and a carrier gas is supplied to the oxide layer at the same time, i.e. removing the formed solid of $(NH_4)_2SiF_6$ in the reaction by evaporation. Referring to FIG. 9, the whole semiconductor structure 400 is heated by the bearing platform 305 so that the temperature of the whole semiconductor structure 400 is at the fourth temperature. The fourth temperature is in a range of 100~200° C., specifically, 110° C., 130° C., 150° C., 170° C. or 190° C. In the present example, the fourth temperature is 150° C. The thermal treatment of the oxide layer is performed to accelerate volatilization of the solid of $(NH_4)_2SiF_6$, nitrogen is simultaneously introduced into the first gas inlet 301 and the second gas inlet 302 to serve as the carrier gas, and the volatilized $(NH_4)_2SiF_6$ solid is brought into the gas outlet (the first gas outlet 303 and the second gas outlet 304), so that etching of the oxide layer on the surfaces of the inclined feature portions 112 is completed.

The feature portions are HAR structures, the inclination of the feature portions is the inclination of the HAR structures, and the inclination of the HAR structures may be avoided when the feature portions are in a vertical state. In the related art, during ashing and cleaning after forming the feature portions by etching, the mask layer on the top surfaces of the feature portions is removed, and the feature portions are inclined under the action of a capillary force. Compared with the related art, the present solution has the advantages that the mask layer on the top surfaces of the feature portions is removed before cleaning, the formed oxide layer is not etched during cleaning, the feature portions are inclined under the action of the capillary force, and then the feature portions are restored to an initial state after the oxide layer is removed, so that the problem of inclination of HAR structures when the HAR structures are cleaned is effectively solved, the process flow is simple, and the cost is low.

The above division of various operations is merely for clarity of description. During implementation, the steps may be combined into one step or some steps may be split and decomposed into multiple steps, which may be within the scope of protection of this patent as long as the same logical relationship is included. It is within the scope of protection of this patent to add insignificant modifications to the process or to introduce insignificant designs without changing the core design of the process.

Another example of the present disclosure provides a semiconductor structure forming method, which includes the following operations. A semiconductor substrate and a mask layer on the semiconductor substrate are provided. The semiconductor substrate is etched to form discrete feature portions by taking the mask layer as a mask. A semiconductor structure which includes the semiconductor substrate, the feature portions and the mask layer, is ashed. The mask layer is removed. The semiconductor structure is cleaned and dried in sequence. An oxide layer is removed.

The semiconductor structure forming method of the present example will be described below in detail with reference to the accompanying drawings.

Referring to FIGS. 1 and 2, a semiconductor substrate 111 is provided. The semiconductor substrate 111 has a mask layer 200 on its top surface. The semiconductor substrate 111 is etched by taking the mask layer 200 as a mask to form discrete feature portions 112.

Specifically, referring to FIG. 1, a mask layer 200 is formed on a substrate 101. The substrate 101 is etched based on the mask layer 200 to form a semiconductor substrate 111 and discrete feature portions 112 as shown in FIG. 2. The feature portions 112 are provided with the mask layer 200. In the present example, the semiconductor substrate 111 is formed of a material such as silicon or germanium, and the mask layer 200 is formed of silicon dioxide. In other examples, the mask layer 200 may be formed of other insulating materials such as silicon nitride or silicon oxynitride. In addition, the feature portions 112 provided in the present example are used for subsequently forming active areas. The inclination of the feature portions 112 may result in the inclination of the formed active areas, i.e., the feature portions 112 in a vertical state may avoid the inclination of the active areas. In addition, the technical solution may also be used for realizing other areas.

Referring to FIG. 2, the height of the feature portions 112 is H, a gap between two adjacent discrete feature portions 112 is S, and an aspect ratio H/S of the feature portions 112 is relatively larger. In the present example, the aspect ratio H/S of the feature portions 112 is 10. In other examples, a preset aspect ratio may be 5, 8, 12, 15, etc., which may be set according to actual demands. In addition, the aspect ratio H/S of the feature portions may also be set to be more than the preset aspect ratio, which may be 5, 8, 10, 12, 15, etc. In the semiconductor manufacturing process where the aspect ratio of the feature portions 112 is large, the defect of inclination of the feature portions 112 readily occurs. It is known to those skilled in the art that limitation of the aspect ratio of the feature portions 112 in the examples is to ensure that the feature portions 112 will incline in a subsequent drying process. The technical solutions in which the feature portions 112 incline subsequently due to the limited aspect ratio also fall within the protection scope of the present disclosure.

The semiconductor structure is ashed. The semiconductor structure includes the semiconductor substrate 111, the feature portions 112 and the mask layer 200. The process of ashing is used for ashing the remaining etching gas or etching liquid to prevent the residual etching gas or etching liquid from continuously etching the semiconductor substrate 111 and the feature portions 112.

Referring to FIG. 3, the mask layer 200 is removed by etching.

Referring to FIG. 4, the semiconductor structure is cleaned. The semiconductor structure includes the semiconductor substrate 111, the feature portions 112 and the mask layer 200. Since the mask layer 200 has been removed, only the semiconductor substrate 111 and the feature portions 112 are cleaned.

The process of cleaning is used for repairing defects on the surfaces of the feature portions 112, i.e. recesses formed by over-etching partial side walls or protrusions formed by incompletely etching partial side walls in the process of forming the feature portions 112 by etching, so that the surfaces of the feature portions 112 are uneven. The surfaces of the feature portions 112 are oxidized to form an oxide layer 120 after the process of cleaning.

Referring to FIG. 5, the semiconductor structure is dried after being cleaned. The semiconductor structure includes the semiconductor substrate 111, the feature portions 112 and the mask layer 200. Since the mask layer 200 has been removed, the semiconductor substrate 111 and the feature portions 112 are dried.

Referring to FIGS. 5 and 6, the oxide layer on the surfaces of the inclined feature portions 112 is removed.

In the present example, after drying, the oxide layers on the surfaces of the inclined feature portions 112 are bonded to form a bonded oxide layer 130 (referring to FIG. 5). After the bonded mask layer 130 is removed, the inclined feature portions 112 are gradually restored (i.e., to a vertical state) since a bonding force of the bonded oxide layer 130 disappears and no capillary force is applied to the inclined feature portions 112.

Since the above examples correspond to the present example, the present example may be implemented in cooperation with the above examples. The related technical details mentioned in the above examples are still valid in the present example, and the technical effects that can be achieved in the above examples may also be achieved in the present example. Descriptions are omitted here in order to reduce repetition. Accordingly, the related technical details mentioned in the present example may also be applied to the above examples.

The above division of various steps is merely for clarity of description. During implementation, the steps may be combined into one step or some steps may be split and decomposed into multiple steps, which may be within the scope of protection of this patent as long as the same logical relationship is included. It is within the scope of protection of this patent to add insignificant modifications to the process or to introduce insignificant designs without changing the core design of the process.

It will be appreciated by those of ordinary skill in the art that the various examples described above are specific examples for implementing the present disclosure and that various changes in form and details may be made in practice without departing from the spirit and scope of the present disclosure.

The invention claimed is:

1. A semiconductor structure processing method, comprising:
   providing a semiconductor substrate, which is provided with feature portions having a mask layer on their top surfaces;
   ashing a semiconductor structure comprising the semiconductor substrate, the feature portions and the mask layer;
   removing the mask layer;
   cleaning the semiconductor structure, and forming an oxide layer on surfaces of the feature portions after the feature portions are cleaned;
   drying the semiconductor structure;
   performing a compensation treatment of the oxide layer to increase a thickness of the oxide layer; and
   removing the oxide layer,
   wherein during drying, one feature portion of at least one group of adjacent feature portions inclines towards another feature portion adjacent thereto, and a distance between said one inclined feature portion and the other feature portion adjacent thereto after drying is smaller than a distance therebetween before drying.

2. The semiconductor structure processing method of claim 1, wherein ashing the semiconductor structure comprises:
   ashing the semiconductor structure by using an oxygen-free first mixed gas.

3. The semiconductor structure processing method of claim 2, wherein the first mixed gas at least comprises hydrogen and nitrogen.

4. The semiconductor structure processing method of claim 1, wherein ashing the semiconductor structure comprises:
   ashing the semiconductor structure by using a second mixed gas which contains oxygen.

5. The semiconductor structure processing method of claim 4, wherein the second mixed gas at least comprises hydrogen, nitrogen and oxygen.

6. The semiconductor structure processing method of claim 1, wherein a mixed liquid of $NH_4OH$, $H_2O_2$ and $H_2O$ is used in the cleaning, and a volume ratio of $NH_4OH$, $H_2O_2$ and $H_2O$ satisfies $NH_4OH:H_2O_2:H_2O=1:1\sim4:20\sim100$.

7. The semiconductor structure processing method of claim 1, wherein drying the semiconductor structure comprises:
   drying the surfaces of the feature portions by using isopropanol at a first temperature; and
   drying the bottom of the semiconductor substrate by using deionized water at a second temperature while drying the surfaces of the feature portions.

8. The semiconductor structure processing method of claim 7, wherein the first temperature is in a range of 60~80° C., and the second temperature is in a range of 60~80° C.

9. The semiconductor structure processing method of claim 1, wherein performing the compensation treatment of the oxide layer comprises:
performing the compensation treatment of the oxide layer by using a third mixed gas which at least comprises hydrogen, nitrogen and oxygen.

10. The semiconductor structure processing method of claim 1, wherein an aspect ratio of the feature portions disposed on the semiconductor substrate is 10.

11. The semiconductor structure processing method of claim 1, wherein performing the compensation treatment of the oxide layer comprises:
performing the compensation treatment of the oxide layer by using mixed plasma which at least comprises plasma of hydrogen, nitrogen and oxygen.

12. The semiconductor structure processing method of claim 1, wherein removing the oxide layer comprises:
supplying a chemical gas to the oxide layer to react with the oxide layer at a third temperature; and
after the reaction, performing a thermal treatment of the oxide layer at a fourth temperature, and supplying a carrier gas to the oxide layer at the same time to remove the oxide layer by evaporation.

13. The semiconductor structure processing method of claim 12, wherein the third temperature is in a range of 30~150° C., and the fourth temperature is in a range of 100~200° C.

14. The semiconductor structure processing method of claim 12, wherein an etching selection ratio of the chemical gas to the mask layer and the feature portions is more than 500:1.

15. The semiconductor structure processing method of claim 14, wherein the chemical gas at least comprises ammonia and hydrogen fluoride, and the carrier gas at least comprises nitrogen or argon.

16. A semiconductor structure forming method, comprising:
providing a semiconductor substrate and a mask layer on the semiconductor substrate;
etching the semiconductor substrate to form discrete feature portions by taking the mask layer as a mask;
ashing a semiconductor structure comprising the semiconductor substrate, the feature portions and the mask layer;
removing the mask layer;
cleaning and drying the semiconductor structure in sequence, wherein an oxide layer is formed on a surface of the semiconductor structure after the semiconductor structure is cleaned;
performing a compensation treatment of the oxide layer to increase a thickness of the oxide layer; and
removing the oxide layer.

17. The semiconductor structure forming method of claim 16, wherein an aspect ratio of the formed feature portions is 10.

18. The semiconductor structure forming method of claim 16, wherein performing the compensation treatment of the oxide layer comprises:
performing the compensation treatment of the oxide layer by using a third mixed gas which at least comprises hydrogen, nitrogen and oxygen.

19. The semiconductor structure forming method of claim 16, wherein performing the compensation treatment of the oxide layer comprises:
performing the compensation treatment of the oxide layer by using mixed plasma which at least comprises plasma of hydrogen, nitrogen and oxygen.

* * * * *